(12) United States Patent
Yama et al.

(10) Patent No.: US 8,900,906 B2
(45) Date of Patent: Dec. 2, 2014

(54) ATOMIC LAYER DEPOSITION STRENGTHENING MEMBERS AND METHOD OF MANUFACTURE

(75) Inventors: Gary Yama, Mountain View, CA (US); Fabian Purkl, Palo Alto, CA (US); Matthieu Liger, Seattle, WA (US); Matthias Illing, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 274 days.

(21) Appl. No.: 13/415,479

(22) Filed: Mar. 8, 2012

(65) Prior Publication Data

US 2013/0234270 A1  Sep. 12, 2013

(51) Int. Cl.
*H01L 21/02* (2006.01)

(52) U.S. Cl.
USPC .................. 438/54; 438/55; 438/57; 438/64; 438/98; 257/431; 257/467; 257/E21.002; 257/E29.166

(58) Field of Classification Search
USPC ...................................... 438/54, 55
See application file for complete search history.

(56) References Cited

U.S. PATENT DOCUMENTS

| | | | |
|---|---|---|---|
| 5,260,233 A | 11/1993 | Buti et al. | |
| 5,300,915 A | 4/1994 | Higashi et al. | |
| 5,310,449 A | 5/1994 | Henderson | |
| 5,399,897 A | 3/1995 | Cunningham et al. | |
| 6,218,667 B1 | 4/2001 | Nonaka et al. | |
| 6,441,374 B1 | 8/2002 | Kawano et al. | |
| 6,667,479 B2 | 12/2003 | Ray | |
| 6,707,121 B2 | 3/2004 | De Moor et al. | |
| 7,288,765 B2 | 10/2007 | Vilain | |
| 7,326,936 B2 | 2/2008 | Kawano et al. | |
| 7,554,085 B2 | 6/2009 | Lee | |
| 7,683,324 B2 | 3/2010 | Vogt | |
| 7,842,533 B2 | 11/2010 | Liger | |
| 7,875,485 B2 * | 1/2011 | Sasagawa et al. | 438/53 |
| 7,884,328 B2 | 2/2011 | Cho et al. | |
| 2003/0062480 A1 * | 4/2003 | Kanzaki | 250/338.1 |
| 2003/0183307 A1 | 10/2003 | Liebeskind et al. | |
| 2004/0232337 A1 * | 11/2004 | Vilain | 250/338.1 |
| 2006/0088980 A1 | 4/2006 | Chen et al. | |
| 2009/0140148 A1 * | 6/2009 | Yang et al. | 250/338.4 |
| 2009/0152466 A1 * | 6/2009 | Cho et al. | 250/338.4 |

(Continued)

FOREIGN PATENT DOCUMENTS

| | | |
|---|---|---|
| WO | 2004025727 A1 | 3/2004 |
| WO | 2010080815 A1 | 7/2010 |

OTHER PUBLICATIONS

International Search Report and Written Opinion corresponding to PCT Application No. PCT/US2013/029763, mailed Sep. 5, 2013 (11 pages).

(Continued)

*Primary Examiner* — Angel Roman
(74) *Attorney, Agent, or Firm* — Maginot Moore & Beck LLP

(57) ABSTRACT

In one embodiment, a method of forming a semiconductor device includes providing a substrate, forming a sacrificial layer above the substrate layer, forming a first trench in the sacrificial layer, forming a first sidewall layer with a thickness of less than about 50 nm on a first sidewall of the first trench using atomic layer deposition (ALD), and removing the sacrificial layer.

19 Claims, 7 Drawing Sheets

(56) References Cited

U.S. PATENT DOCUMENTS

| | | |
|---|---|---|
| 2009/0154872 A1 | 6/2009 | Sherrer et al. |
| 2009/0207879 A1* | 8/2009 | Kurashina .................... 374/133 |
| 2010/0171190 A1* | 7/2010 | Liger .......................... 257/428 |
| 2010/0197063 A1 | 8/2010 | Bluzer et al. |
| 2011/0049366 A1* | 3/2011 | Yang et al. ................ 250/338.4 |

OTHER PUBLICATIONS

Yoneoka, S. et al., "ALD-Metal Uncooled Bolometer", IEEE 24th International Conference on Micro Electro Mechanical Systems, IEEE, United States, Jan. 23, 2011, pp. 676-679 (4 pages).

Reinert et al., "Vacuum wafer bonding technology," VABOND public report, in IMAPS Nordic 2004, 26 pages.

* cited by examiner

ATOMIC LAYER DEPOSITION STRENGTHENING MEMBERS AND METHOD OF MANUFACTURE

FIELD

This disclosure relates to semiconductor sensor devices and methods of fabricating such devices.

BACKGROUND

Objects at any non-zero temperature radiate electromagnetic energy which can be described either as electromagnetic waves or photons, according to the laws known as Planck's law of radiation, the Stefan-Boltzmann Law, and Wien's displacement law. Wien's displacement law states that the wavelength at which an object radiates the most ($\lambda_{max}$) is inversely proportional to the temperature of the object as approximated by the following relation:

$$\lambda_{max}(\mu m) \approx \frac{3000}{T(K)}$$

Hence for objects having a temperature close to room temperature, most of the emitted electromagnetic radiation lies within the infrared region. Due to the presence of $CO_2$, $H_2O$, and other gasses and materials, the earth's atmosphere absorbs electromagnetic radiation having particular wavelengths. Measurements have shown, however, that there are "atmospheric windows" where the absorption is minimal. An example of such a "window" is the 8 µm-12 µm wavelength range. Another window occurs at the wavelength range of 3 µm-5 µm. Typically, objects having a temperature close to room temperature emit radiation close to 10 µm in wavelength. Therefore, electromagnetic radiation emitted by objects close to room temperature is only minimally absorbed by the earth's atmosphere. Accordingly, detection of the presence of objects which are either warmer or cooler than ambient room temperature is readily accomplished by using a detector capable of measuring electromagnetic radiation emitted by such objects.

One commonly used application of electromagnetic radiation detectors is for automatically energizing garage door lights when a person or car approaches. Another application is thermal imaging. In thermal imaging, which may be used in night-vision systems for driver assistance, the electromagnetic radiation coming from a scene is focused onto an array of detectors. Thermal imaging is distinct from techniques which use photomultipliers to amplify any amount of existing faint visible light, or which use near infrared (~1 µm wavelength) illumination and near-infrared cameras.

Two types of electromagnetic radiation detectors are "photon detectors" and "thermal detectors". Photon detectors detect incident photons by using the energy of said photons to excite charge carriers in a material. The excitation of the material is then detected electronically. Thermal detectors also detect photons. Thermal detectors, however, use the energy of said photons to increase the temperature of a component. By measuring the change in temperature, the intensity of the photons producing the change in temperature can be determined.

In thermal detectors, the temperature change caused by incoming photons can be measured using temperature-dependant resistors (thermistors), the pyroelectric effect, the thermoelectric effect, gas expansion, and other approaches. One advantage of thermal detectors, particularly for long wavelength infrared detection, is that, unlike photon detectors, thermal detectors do not require cryogenic cooling in order to realize an acceptable level of performance.

One type of thermal sensor is known as "bolometer." Even though the etymology of the word "Bolometer" covers any device used to measure radiation, bolometers are generally understood to be to thermal detectors which rely on a thermistor to detect radiation in the long wavelength infrared window (8 µm-12 µm) or mid-wavelength infrared window (3 µm-5 µm).

Because bolometers must first absorb incident electromagnetic radiation to induce a change in temperature, the efficiency of the absorber in a bolometer relates to the sensitivity and accuracy of the bolometer. Ideally, absorption as close to 100% of incident electromagnetic radiation is desired. In theory, a metal film having a sheet resistance (in Ohms per square) equal to the characteristic impedance of free space, laying over a dielectric or vacuum gap of optical thickness d will have an absorption coefficient of 100% for electromagnetic radiation of wavelength 4d. The following relation shows the expression of the characteristic impedance (Y) of free space:

$$Y = \sqrt{\frac{\mu_0}{\varepsilon_0}}$$

wherein $\varepsilon_0$ is the vacuum permittivity and $\mu_0$ is the vacuum permeability.

The numerical value of the characteristic impedance of free space is close to 377 Ohm. The optical length of the gap is defined as "nd", where n is the index of refraction of the dielectric, air or vacuum.

In the past, micro-electromechanical systems (MEMS) have proven to be effective solutions in various applications due to the sensitivity, spatial and temporal resolutions, and lower power requirements exhibited by MEMS devices. One such application is as a bolometer. Known bolometers use a supporting material which serves as an absorber and as a mechanical support. Typically, the support material is silicon nitride. A thermally sensitive film is formed on the absorber to be used as a thermistor. The absorber structure with the attached thermistor is anchored to a substrate through suspension legs having high thermal resistance in order for the incident electromagnetic radiation to produce a large increase of temperature on the sensor.

The traditional technique used to micromachine suspended members involves the deposition of the material over a "sacrificial" layer, which is to be eventually removed and which is deposited, e.g., by spin coating or polymer coating using a photoresist. The deposition of the thin-film metal or semiconductor can be done with a variety of techniques including low-pressure chemical vapor deposition (LPCVD), epitaxial growth, thermal oxidation, plasma-enhanced chemical vapor deposition (PECVD), sputtering, and evaporation.

Most of the known processes, however, have inherent limitations with respect to fabrication of bolometers. For example, in order to retain functionality, silicon wafers which inhere a CMOS (or a part thereof) must not be exposed to temperatures higher than about 500° C. This temperature limitation eliminates several of the deposition techniques mentioned above.

Additionally, it is very difficult to reliably fabricate a suspended thin-film metal using the traditional deposition techniques of sputtering, evaporation or PECVD due to problems of poor step coverage, thickness uniformity and control, and stress control. Moreover, even when very thin layers are fabricated, those layers may exhibit reduced strength or reduced rigidity which can adversely affect sensor dependability and accuracy. Thin metal layers are of particular interest if the 377 ohm/sq. criterion is to be met or approached.

What is needed is a method of fabricating thin membranes and structures such as could be used in a bolometer which exhibit improved strength or rigidity.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In accordance with one embodiment, there is provided a method of forming a semiconductor device which includes providing a substrate, forming a sacrificial layer above the substrate layer, forming a first trench in the sacrificial layer, forming a first sidewall layer with a thickness of less than about 50 nm on a first sidewall of the first trench using atomic layer deposition (ALD), and removing the sacrificial layer.

In a further embodiment, a complementary metal oxide semiconductor (CMOS) sensor device includes a CMOS substrate, a first sidewall extending upwardly away from the CMOS substrate, the first sidewall having a wall thickness of less than about 50 nm, and a second sidewall extending upwardly away from the CMOS substrate, the second sidewall formed on the first sidewall.

DESCRIPTION

Figure 1:
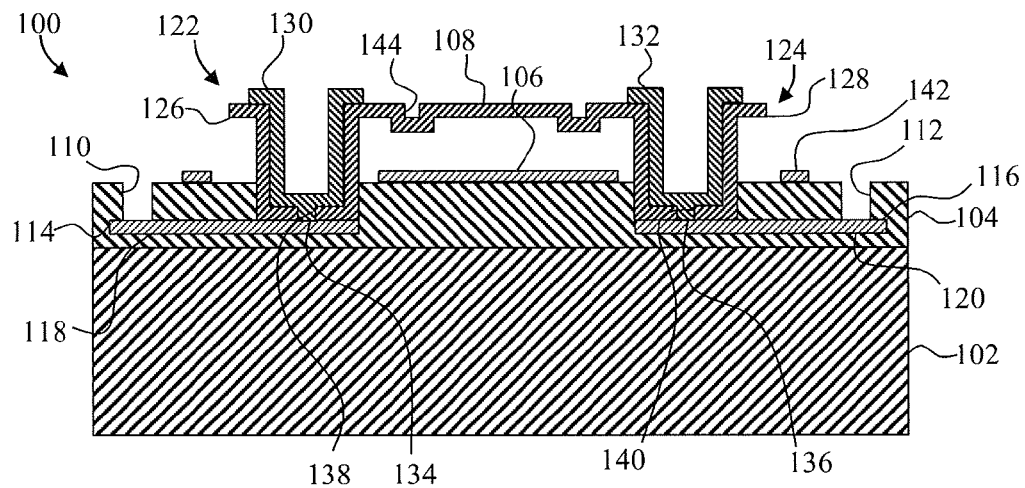
FIG. 1 depicts a side cross-sectional view of a bolometer device taken along line A-A of FIG. 2, the bolometer device including an absorber that provides the function of a thermistor in accordance with principles of the present disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art to which this disclosure pertains.

Figure 2:
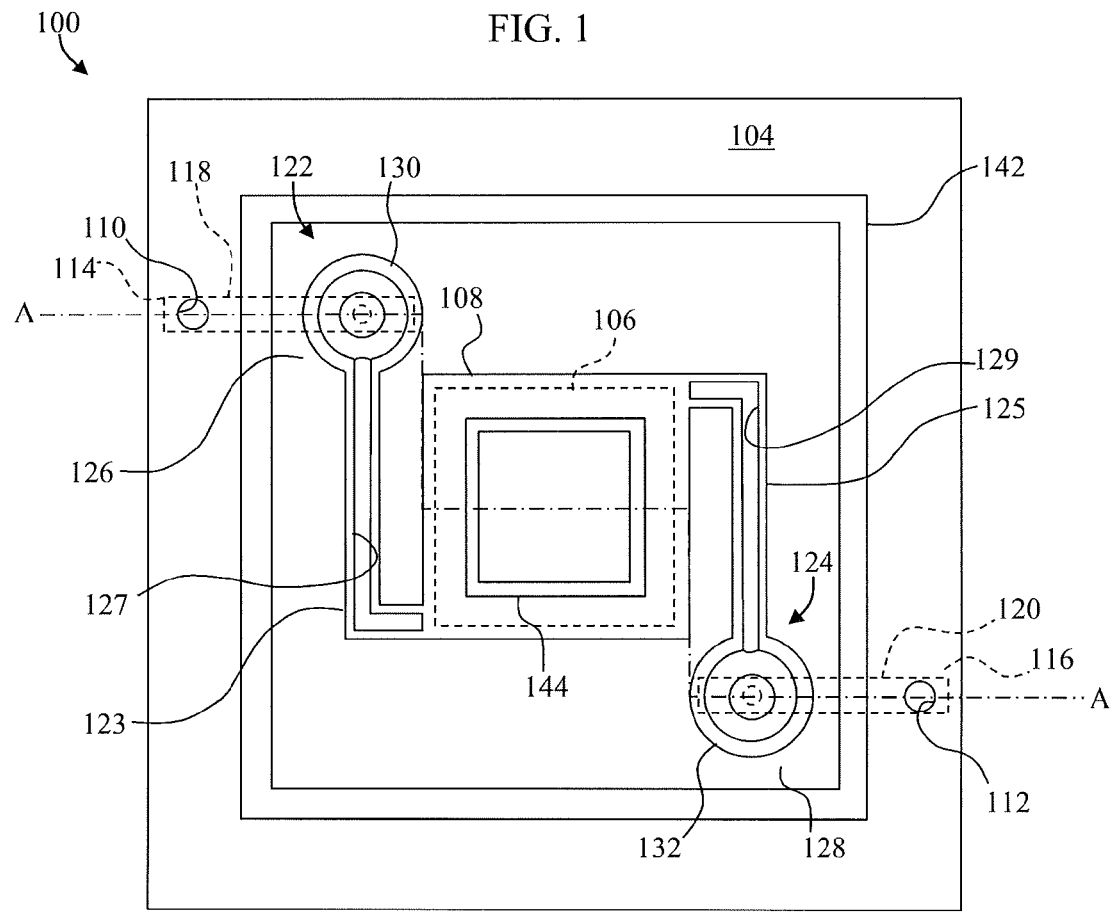
FIG. 2 depicts a top plan view of the bolometer of FIG. 1.

A semiconductor sensor 100 is depicted in FIGS. 1 and 2. FIG. 1 depicts a side cross-sectional view of the semiconductor sensor 100, which in this embodiment is a bolometer, while FIG. 2 is a top plan view of the sensor 100. The sensor 100 may be formed on a complementary metal oxide semiconductor (CMOS) substrate or on another type of substrate. The sensor 100 includes a substrate 102, an insulator layer 104, a mirror 106 and an absorber 108. The substrate 102, which in this embodiment is a silicon wafer that may include one or more sensors 100, includes the electronic circuitry used to access the output of the sensor 100.

The insulator layer 104 may be a deposited dielectric like, e.g., $SiO_2$, which includes access openings 110 and 112 which provide access to bond pads 114 and 116, respectively, within the insulator layer 104. The bond pads 114 and 116 are conductively connected to respective buried feed-throughs 118 and 120 which extend within the insulator layer 104 to conductive support posts 122 and 124.

The support posts 122 and 124 extend upwardly from the buried feed throughs 118 and 120 to support the absorber 108 at a location above the upper surface of the insulator layer 104. Each of the support posts 122/124 include a conductive post portion 126/128 which is integrally formed with the absorber 108. The support posts 122/124 support the absorber 108 through respective support bars 123/125. The support bars 123/125 include trenches 127/129.

Anchor portions 130/132 are located within the conductive post portions 126/128 and include extensions 134/136 which extend through openings 138/140 in the conductive post portions 126/128 to the buried feed throughs 118/120. The anchor portions 130/132 may be formed from a conductive material.

The mirror 106 is located on the upper surface of the insulator layer 104 along with a bond ring 142. The bond ring 142 extends completely about the support posts 122/124 and the absorber 108 but inside of the access openings 110 and 112. The bond ring 142 may be used to form a bond with a cap (not shown) thereby protecting the absorber 108 while the access openings and structures within the insulator layer 104 allow for electrical communication between the absorber 108 and external electronics. The cap further allows encapsulation of a vacuum in the space occupied by the absorber 108 to ensure proper and reliable operation of the sensor 100.

The mirror 106 is directly beneath the absorber 108 and may be, for example, a metal reflector or a multilayer dielectric reflector. The absorber 108 is spaced apart from the mirror 106 by a gap of about 2.0 to 3.0 µm. The gap in this embodiment is selected to optimize absorption in the long-wavelength infrared region (8-15 microns).

The absorber 108, in addition to absorbing energy from incident photons, is selected to provide a good noise-equivalent temperature difference (NETD). In order for the absorber 108 to have a good NETD, the material selected to form the absorber 108 should exhibit a high temperature coefficient of resistance while exhibiting low excess noise (1/f noise). Semiconductor materials such as vanadium oxide are common in micromachined bolometers due to their high temperature coefficient of resistance. While metals have a lower temperature coefficient of resistance than some semiconductor materials, such as vanadium oxide, metals typically have much lower excess noise than many semiconductor materials, thus offering better NETD.

Accordingly, in one embodiment the absorber 108 comprises metal. Titanium and Platinum are two metals which exhibit desired characteristics. Titanium, for example, exhibits a bulk resistivity of about $7*10^{-7}$ Ohm. Using a bulk resistivity of $7*10^{-7}$ Ohm, the thickness of the absorber 106 needed to match the impedance of free-space (377 Ohm/square) should be about 1.9 nm. The resistivity of materials formed to a thickness less than about 50 nm, however, can be several times higher than the bulk value. Accordingly, depending on process parameters, the thickness of the absorber 108, if made from titanium, is preferably about 10 nm. Impurities can also be introduced into the absorber 108 during formation in order to tune the resistivity if needed.

Consequently, the thickness of the absorber 108 in this embodiment is about 10 nm and the length of the absorber 108 from the support post 122 to the support post 124 is about 18 µm. This configuration provides a ratio between the thickness of the absorber 108 and the length of the absorber 108 on the order of 1/1000 and the ratio of the thickness of the absorber 108 to the gap width of about 1/100.

While decreased thickness of the absorber 108 is advantageous functionally, the reduced amount of material in some embodiments may result in undesired deformation of the absorber due to the reduced strength of the absorber. Deformation is reduced in the embodiment of FIGS. 1 and 2 by inclusion of a reinforcement trench 144. The reinforcement trench 144 extends about the entire perimeter of the absorber 108 close to the edge of the absorber 108. In the embodiment of FIGS. 1 and 2, the trench 144 is spaced apart from the trenches 127 and 129. In other embodiments, the trenches may be joined.

Inclusion of the trench 144 allows the support posts 122/124 to provide adequate support even though the support posts 122/124 are located at or about the midpoint of opposite sides of the generally rectangular absorber 108. The support posts 122/124 provide mechanical support for the absorber 108 and are designed to have a high thermal resistivity. The required strength is provided by the anchor portions 130/132. The anchor portions 130 and 132 further act as heat sinks for conductive post portions 126/128. The total resistance for the sensor measured across the support posts 122/124 and the absorber 108 is defined by the following equation:

$$R = 2R_s + R_a$$

where $R_s$ is the resistance of each of the support bars 123/125 and $R_a$ is the resistance of the thin-film absorber 108. The resistance of the support posts 122/124 is de minimis because of the relatively large bulk of material. By way of example, the anchor portions 130/132 may be a sputtered metal having a nominal thickness of 200 nm while the absorber, as noted above, has a thickness of less than about 50 nm.

Upon impingement of the absorber 108 with electromagnetic radiation, the temperature of the absorber 108 increases by $\Delta T$. Assuming that the temperature profile along the support bars 123/125 is linear, the average temperature increase of the support bars 123/125 is $\Delta T/2$. The electrical resistance of the sensor upon incident radiation changes by an amount $\Delta R$ given by:

$$\Delta R = 2\alpha R_s \frac{\Delta T}{2} + \alpha R_a \Delta T$$

where $\alpha$ is the temperature coefficient of resistance of the thin film. Resolving the foregoing equation results in the following equation:

$$\Delta R = \alpha \Delta T (R_s + R_a)$$

Because the support bars 123/125 are designed to have a high thermal resistivity, the total electrical resistance of the sensor 100 is dominated by that of the support bars 123/125 (i.e. $R_s$ is much greater than $R_a$) so that:

$$\Delta R \approx \alpha \Delta T R_s$$

Thus, when electromagnetic radiation (e.g. infrared light) reaches the sensor 100, the electromagnetic radiation is absorbed within the thin-film metal of the absorber 108 with an efficiency depending on the resistivity of the absorber 108, quality of the mirror 106, gap height between the absorber 108 and the mirror 106, and radiation wavelength. Upon absorbing the incident radiation, the absorber 108 undergoes an increase in temperature. This temperature increase, in turn, leads to either a decrease or increase of the resistivity of the absorber 108. The absorber 108 is then electrically probed to measure the resistivity of, and thus indirectly measure the amount of incident electromagnetic radiation on, the absorber 108.

Due to the typical resistivity of deposited metals and semiconductors, the suspended thin-film absorber 108 must have a thickness inferior to 50 nm. Features of the deposition technique known as atomic layer deposition is preferred over traditional micromachining techniques, e.g. sputtering and evaporation, in forming the absorber 108. One advantage of this device over many known devices is its simplicity of fabrication which is explained with reference to FIGS. 3-12.

Figure 3:
FIG. 3 depicts a side cross-sectional view taken along a line similar to the line A-A of FIG. 2, of a device substrate which in this embodiment is a complementary metal oxide semiconductor (CMOS), with a partial insulator layer formed on the substrate in accordance with principles of the present disclosure.

Fabrication of a sensor such as the sensor 100 begins with preparation of a substrate 150 which is shown in FIG. 3. The substrate 150 may be a portion of a larger substrate that is used to form a number of sensors. An initial insulator layer portion 152 is formed on the upper surface of the substrate 150. In this example, an oxide film of about 1000 A is formed on the substrate 150.

Figure 4:
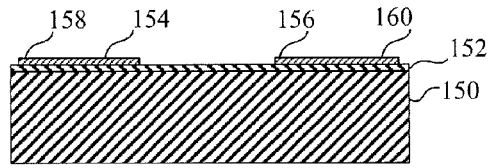
FIG. 4 depicts a side cross-sectional view taken along a line similar to the line A-A of FIG. 2, of the device of FIG. 3 after feed throughs and associated bond pads have been formed on the partial insulator layer.
Figure 5:
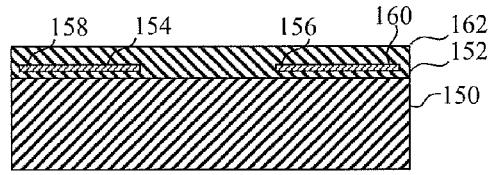
FIG. 5 depicts a side cross-sectional view taken along a line similar to the line A-A of FIG. 2, of the device of FIG. 4 after the remainder of the insulator layer has been formed above the feed throughs and associated bond pads.
Figure 11:
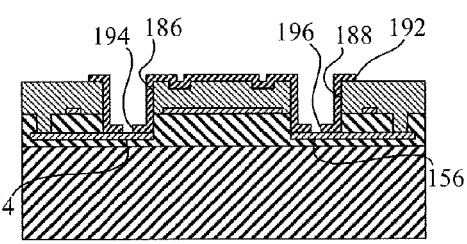
FIG. 11 depicts a side cross-sectional view taken along a line similar to the line A-A of FIG. 2, of the device of FIG. 10 with anchor openings formed in the bottom of the absorber layer within the openings thereby exposing a portion of the feed throughs.

Next, feed throughs 154 and 156 along with associated bond pads 158 and 160 are formed on the upper surface of the initial insulator layer portion 152 (FIG. 4). The feed throughs 154/156 and the bond pads 158/160 are formed from a conducting metal by any acceptable process such as one incorporating lithography and plasma etching. The remainder of the insulator layer 162 is then formed thereby encapsulating the feed throughs 154/156 and the bond pads 158/160 (FIG. 5). The insulator layer 162 may be planarized if desired. In some embodiments, one or more of the feed throughs 154/156 may be connected to another portion of the CMOS device, e.g., a transistor.

Figure 6:
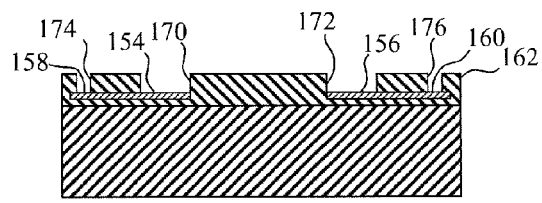
FIG. 6 depicts a side cross-sectional view taken along a line similar to the line A-A of FIG. 2, of the device of FIG. 5 with openings formed through the insulator layer to expose the bond pads and a portion of the feed throughs.
Figure 7:
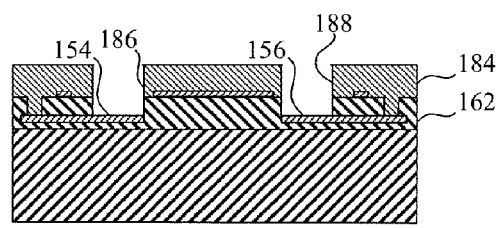
FIG. 7 depicts a side cross-sectional view taken along a line similar to the line A-A of FIG. 2, of the device of FIG. 6 with a mirror and a bond ring formed on top of the insulator layer.
Figure 8:
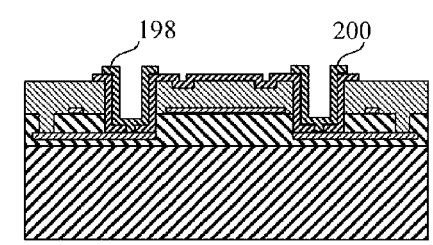
FIG. 8 depicts a side cross-sectional view taken along a line similar to the line A-A of FIG. 2, of the device of FIG. 7 after a sacrificial layer has been formed over the substrate, and openings through the sacrificial layer to the feed throughs have been formed.

Referring to FIG. 6, portions of the feed throughs 154/156 and the bond pads 158/160 are then exposed by etching a trench completely through the insulator layer 162 to form openings 170, 172, 174, and 176, respectively. In FIG. 7, a mirror 180 and a bond ring 182 are formed on the upper layer of the insulator layer 162. The mirror 180 and the bond ring 182 may be formed by sputtering, lithography, and etching, or any other acceptable process. The bond ring 182 and the mirror 180 may be formed simultaneously if desired.

A sacrificial layer 184 is then formed over the top of the insulator layer 162, the mirror 180, and the bond ring 182 (FIG. 8) and openings 186 and 188 are formed by etching a trench completely through the sacrificial layer 184 to expose portions of the feed throughs 154 and 156, respectively.

In embodiments wherein electrical contact is provided using through silicon vias in the backside of the substrate 150, the insulator layer 162 is not needed. Moreover, the mirror 180 may also be formed using the same material used to form the feed throughs 154/156. Thus, the layers depicted in FIGS. 3-12 as 162 and 184 may be formed as a single layer.

Figure 9:
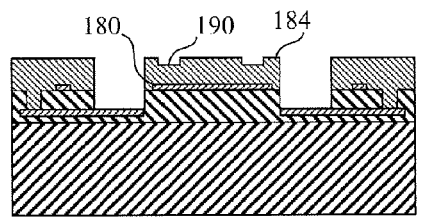
FIG. 9 depicts a side cross-sectional view taken along a line similar to the line A-A of FIG. 2, of the device of FIG. 8 with a trench formed in the sacrificial layer above the mirror and inside of the openings of FIG. 8.

As shown in FIG. 9, a trench 190 is formed in the upper surface of the sacrificial layer 184 directly above the mirror 180. The openings 186/188 and the trench 190 may be formed using spin photoresist and lithography. While not shown in FIG. 9 due to the view provided, trenches (not shown) which are used to form trenches in the support arms are also formed in the upper surface of the sacrificial layer 184.

Figure 10:
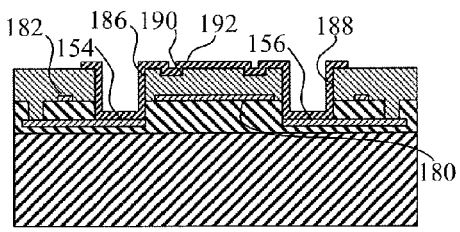
FIG. 10 depicts a side cross-sectional view taken along a line similar to the line A-A of FIG. 2, of the device of FIG. 9 with an absorber layer formed within the openings and trench and directly above the mirror without extending into the portion of the sacrificial layer directly above the bond ring.

An absorber layer 192 is then formed above a portion of the sacrificial layer 184, on the exposed surface portions of the feed throughs 154/156, on the sides of the openings 186 and 188, and along the walls and bottom of the trench 190 and the trenches (not shown) used to form trenches in the support arms and patterned by using a lithography mask and a following etching step. The final result is depicted in FIG. 10. An "absorber layer" is a layer of material that exhibits efficient energy absorption from incident photons and good noise-equivalent temperature difference (NETD). As used herein, "good NETD" means that the material functions as a thermistor as well as an absorber.

The absorber layer 192 is preferably formed by atomic layer deposition (ALD). ALD is used to deposit materials by exposing a substrate to several different precursors sequentially. A typical deposition cycle begins by exposing a substrate is to a precursor "A" which reacts with the substrate surface until saturation. This is referred to as a "self-terminating reaction." Next, the substrate is exposed to a precursor "B" which reacts with the surface until saturation. The second self-terminating reaction reactivates the surface. Reactivation allows the precursor "A" to react with the surface. Typically, the precursors used in ALD include an organometallic precursor and an oxidizing agent such as water vapor or ozone.

The deposition cycle results, ideally, in one atomic layer being formed. Thereafter, another layer may be formed by repeating the process. Accordingly, the final thickness of the absorber layer 192 is controlled by the number of cycles a substrate is exposed to. Moreover, deposition using an ALD process is substantially unaffected by the orientation of the particular surface upon which material is to be deposited. Accordingly, an extremely uniform thickness of material may be realized both on the horizontal surfaces (the sacrificial layer 184, the exposed surface portions of the feed throughs 154/156, and the bottom of the trench 190) and on the vertical surfaces (the sides of the openings 186 and 188, the walls of the trench 190).

In some embodiments, it may be desired to form structures using multiple layers of ALD material. For example, while the device in the present example includes a single absorber layer 192, a stacked absorber may be useful in different embodiments. A stacked absorber or other structure may have two, three, or more layers of different or alternating materials. For example, a layer of insulating material may provide a substrate for a layer of a conducting material with yet another insulating material above the conducting material. A very thin conducting layer may thus be protected and strengthened by being sandwiched between two very thin insulating layers. $Al_2O_3$ may be used as an insulating layer deposited using ALD.

Figure 12:
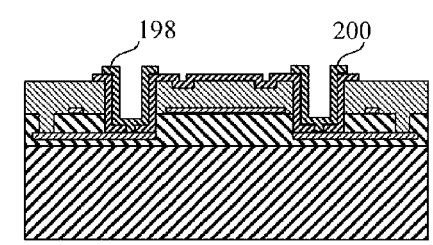
FIG. 12 depicts a side cross-sectional view taken along a line similar to the line A-A of FIG. 2, of the device of FIG. 11 with a thin anchor layer formed on the absorber layer in the openings and on the exposed portion of the feed throughs.

Once the absorber layer 192 is formed, anchor holes 194 and 196 (FIG. 11) are etched or milled though the bottom of the absorber layer 192 within the openings 186 and 188 to expose a portion of the feed throughs 154/156. After masking the device, an anchor layer is formed resulting in anchor portions 198 and 200 as shown in FIG. 12. The anchor portions 198 and 200 in some embodiments may be sputter deposited to provide a desired bulk of material. In further embodiments, the anchor portions 198 and 200 may be deposited by ALD. In stacked arrangements wherein the lowest layer of the absorber stack is non-conductive, the anchor portions 198 and 200 may be used to provide electrical conductivity to the conductive layer in the stack. The sacrificial layer 184 is then etched to form the final device, such as the sensor 100 of FIGS. 1 and 2.

Figure 13:
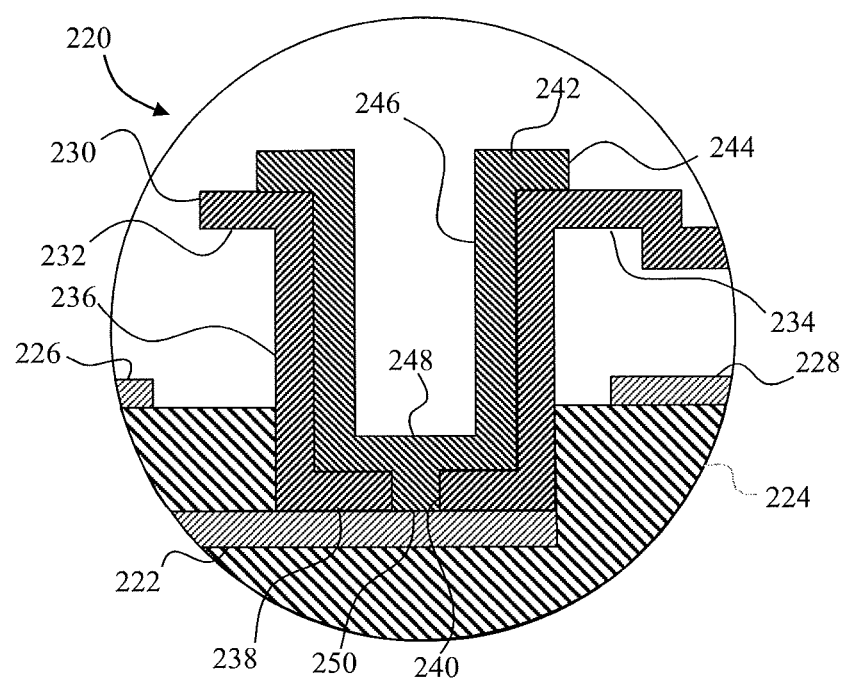
FIG. 13 depicts a partial side cross-sectional view of a support post of FIG. 12 including a conductive post portion with sidewalls and a lip strengthening member, and anchor portion formed on the conductive post portion and including sidewalls and a lip strengthening member.

In the foregoing embodiments, support posts such as the support post 220 of FIG. 13 are used to provide structural stability and electrical conductivity while presenting a small footprint. The support post 220 is positioned on a feed through 222 that is buried within an insulator layer 224. A bond ring 226 and a mirror 228 are located on an upper surface of the insulator layer 224.

The support post 220 includes a conductive post portion 230 that in this embodiment is formed by ALD. The conductive post portion 230 includes a lip 232 which extends completely about the support post 220. The lip 232 acts as a strengthening member for the support post 220 and is further used to support a structure 234. In the embodiment of FIG. 13, the structure 234 is integrally formed with the lip 232. The lip 232 is formed so that the lip 232 does not extend to a location directly over the bond ring 226. This allows a cap, not shown, to be mounted to the bond ring 226 without contacting the conductive post portion 230.

The conductive post portion 230 also includes a sidewall 236 which extends from the lip 232 to a location within the insulator layer 224 so as to abut the buried feed through 222. The conductive portion 230 thus provides a conduction path from the structure 234 to the feed through 222. Additional connectivity between the conductive post portion 230 and the buried feed through 222 is provided by a bottom portion 238 of the conductive post 230 that is positioned on the upper surface of the feed through 222. An anchor hole 240 is formed in the bottom portion 238 directly above a portion of the feed through 222.

The support post 220 further includes an anchor portion 242. The anchor portion 242 includes a lip 244 formed on the lip 232. A sidewall 246 of the anchor portion 242 is formed on the sidewall 236 and extends from the lip 244 to a bottom portion 248 formed on the bottom portion 238 of the conductive post portion 230. An extension 250 extends from the bottom portion 248 through the anchor hole 240 and abuts the feed through 222.

The support post 220 provides a number of benefits and allows for a large number of design choices. By way of example, in embodiments wherein the conductive post portion is a material that does not bond well with the selected feed through material, an anchor portion material that forms a stronger bond with the feed through material may be selected while the conductive post portion material is optimized for conductance. Additionally, the anchor material may be selected to provide increased strength or desired thermal characteristics as compared to the material used in the conductive post portion. The lips 232 and 244 also provide increased strength for the support post 220. This allows for a significantly reduced footprint.

Figure 14:
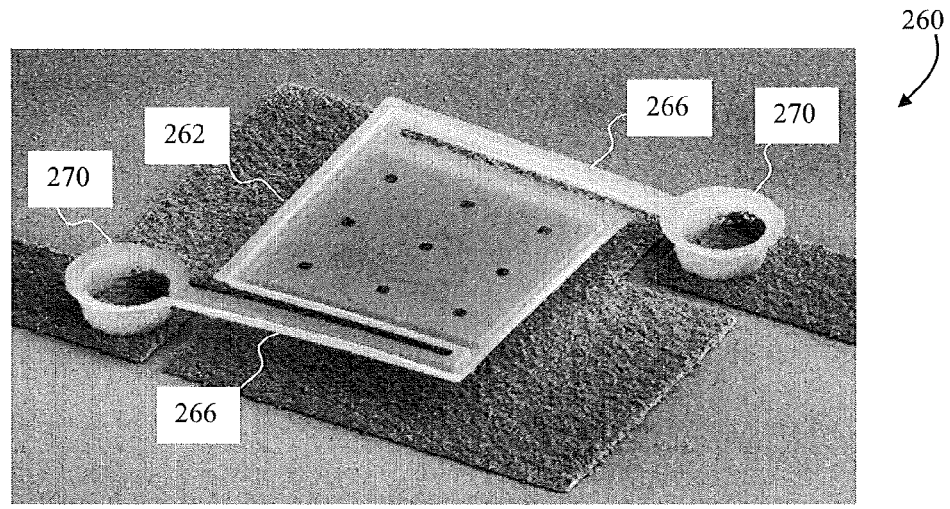
FIGS. 14 and 15 depict scanning electron microscope (SEM) microphotographs of a device which may be formed in accordance with principles of the disclosure discussed with reference to FIGS. 3-12.
Figure 15:
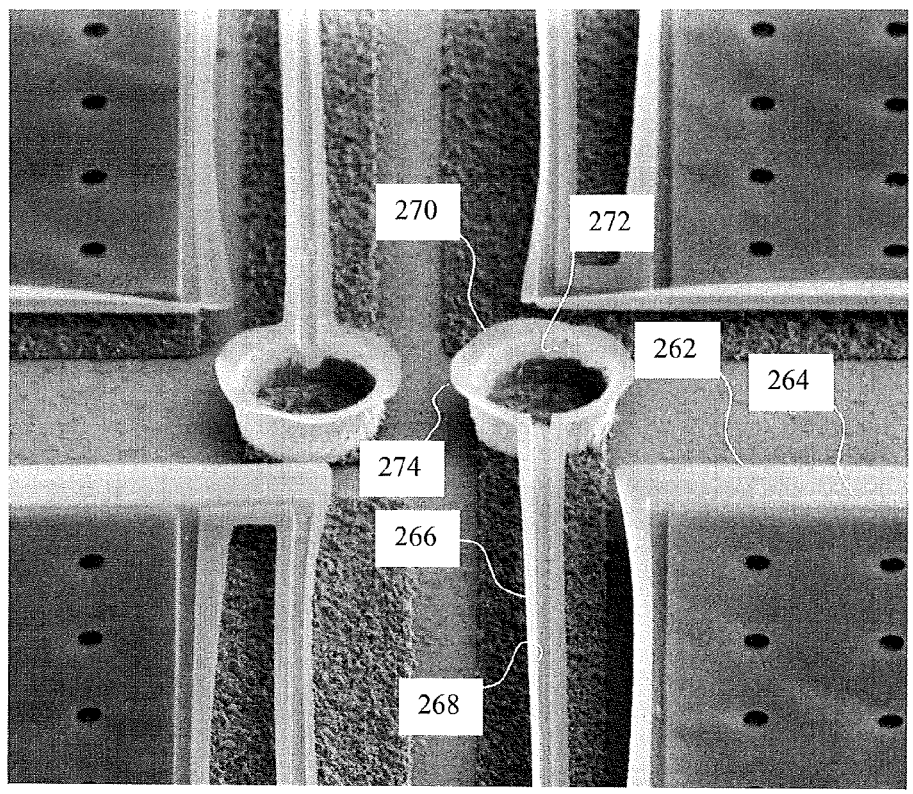

A microphotograph of a device 260 formed in accordance with the process described above with respect to FIGS. 3-12 is depicted in FIG. 14. The device 260, a portion of which is shown in FIG. 15 prior to dicing of the substrate upon which the device 260 was formed, includes a membrane 262 with a strengthening member in the form of a trench 264 (FIG. 15). The membrane 262 is supported by support arms 266, which also include a strengthening member in the form of a trench 268, which are in turn supported by support posts 270. The support posts 270 include sidewalls 272 and rims 274.

Figure 16:
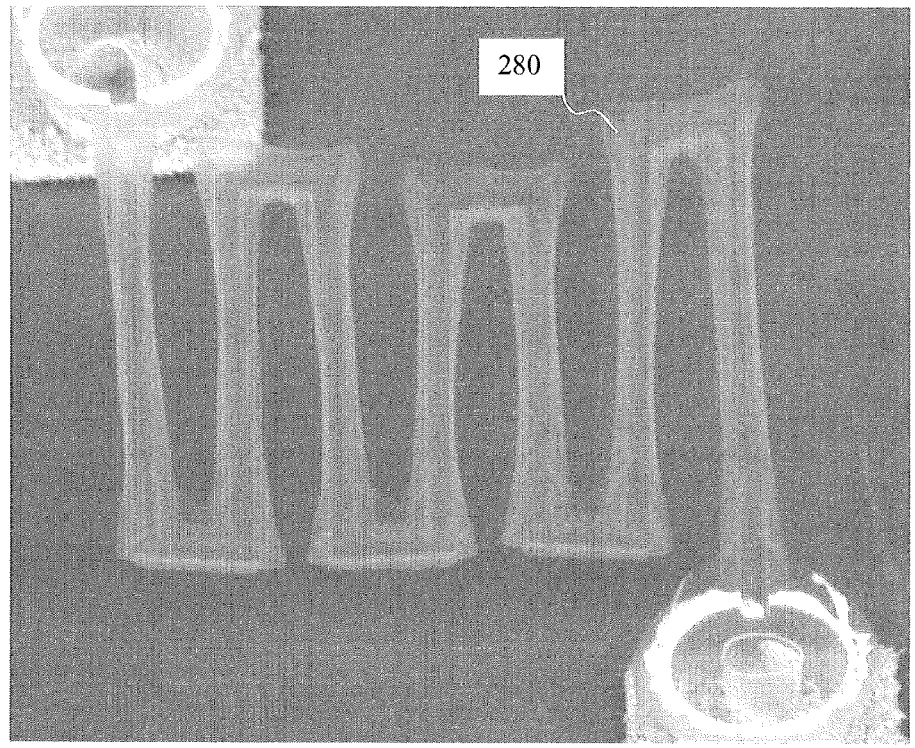
FIG. 16 depicts a SEM microphotograph of a membrane in a serpentine form which may be formed in accordance with principles of the disclosure discussed with reference to FIGS. 3-12.

The increased strength of a device formed in accordance with the present disclosure allows for a variety of different membranes to be supported by a variety of configurations. By way of example, FIG. 16 depicts a surface electron microscope (SEM) microphotograph of a membrane 280 that includes a strengthening member in the form of a trench. The membrane 280 has a serpentine shape.

Figure 17:
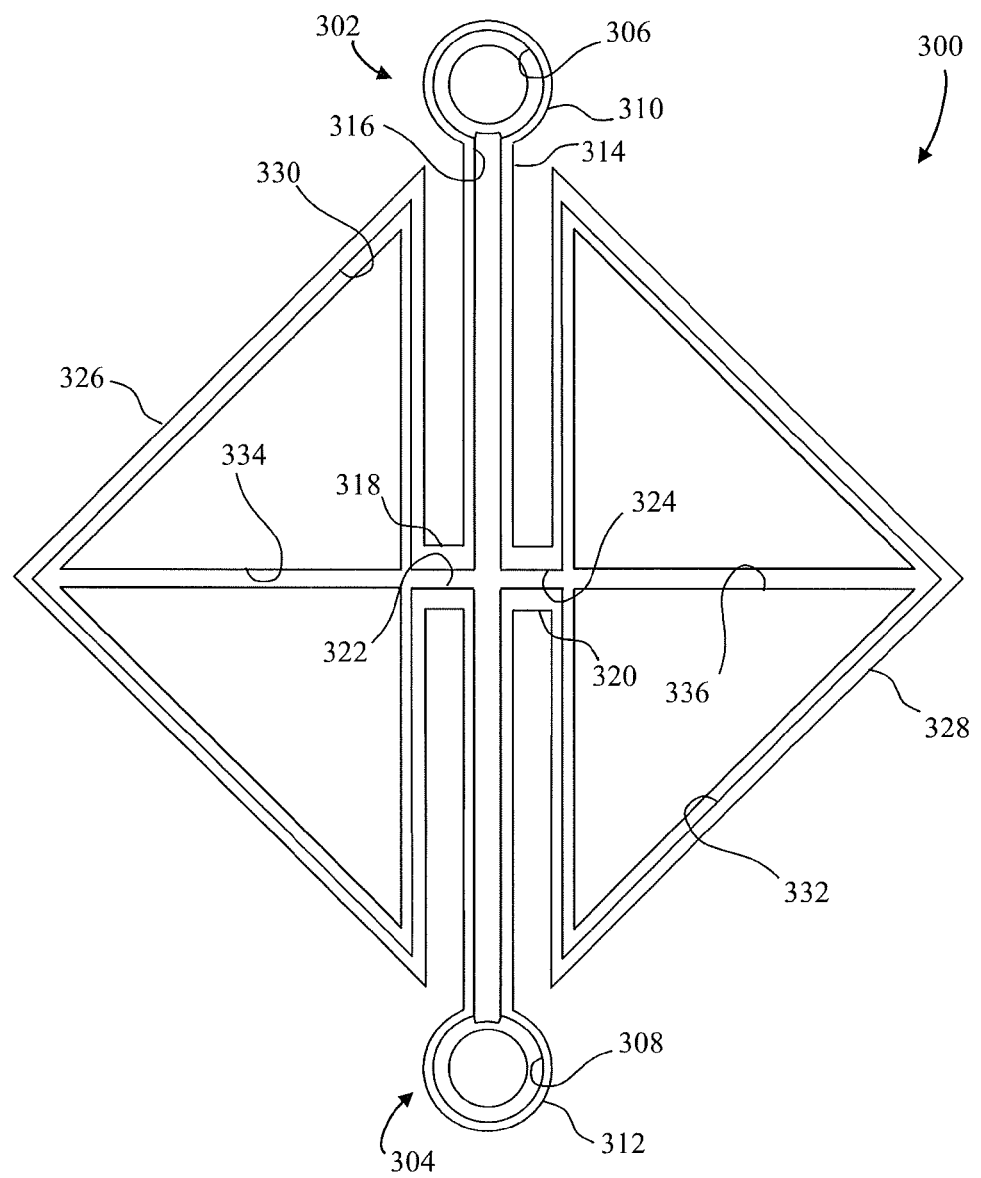
FIG. 17 depicts an alternative form of a device in accordance with principles of the disclosure wherein two membranes are supported by a single connection to a support arm.

FIG. 17 depicts a device 300 which includes support posts 302/304. Each of the support posts 302/304 includes a sidewall 306/308 and a lip 310/312. The support posts 302/304 support a support beam 314 that includes a strengthening member 316 in the form of a trench. Two auxiliary support beams 318/320 are located at about the midpoint of the support beam 314 and include strengthening members 322/324 in the form of a trench. Each of the auxiliary support beams 318/320 supports a respective membrane 326/328. The membranes 326/328 each include a perimeter strengthening member 330/332 as well as an internal strengthening member 334/336. The inclusion of the internal strengthening members 334/336 in addition to the perimeter strengthening members 330/332 allow the membranes 326/328 to maintain a substantially flat form even though supported at a single point.

Figure 18:
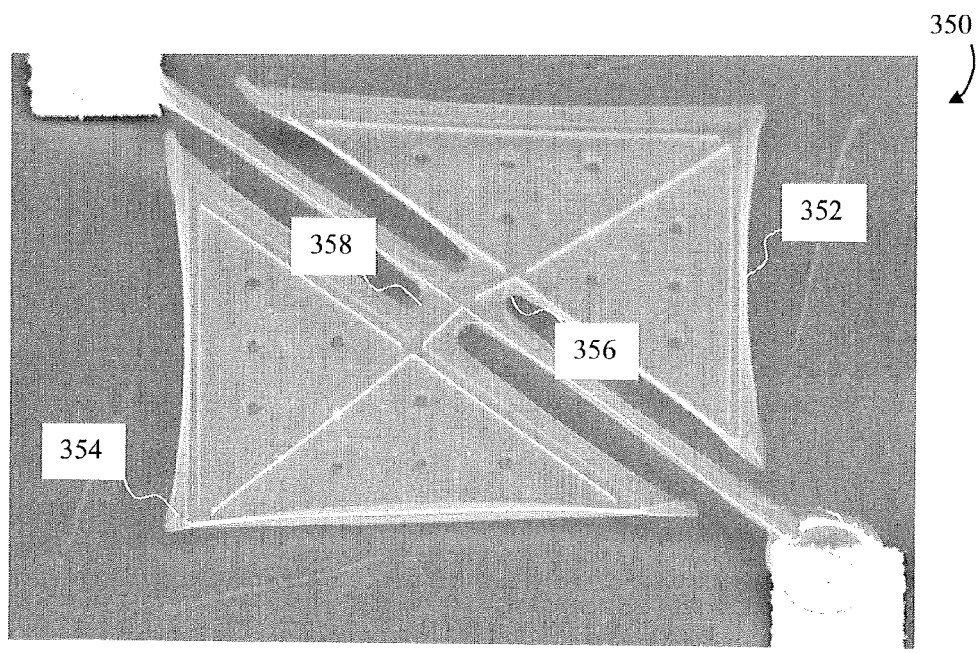
FIG. 18 depicts a SEM microphotograph of a device like the device of FIG. 17 which may be formed in accordance with principles of the disclosure discussed with reference to FIGS. 3-12.

Proof of the ability to support a thin membrane at a single point by incorporating strengthening members is shown in FIG. 18. In FIG. 18, a device 350 is formed substantially identically to the device 300. The device 350 includes two membranes 352/354 which are supported at a single location by auxiliary support beams 356/358. The strengthening members incorporated into the membranes 352/354 maintain the membranes 352/354 in a substantially flat orientation even though the membranes 352/354 are only supported at a single location.

Figure 19:
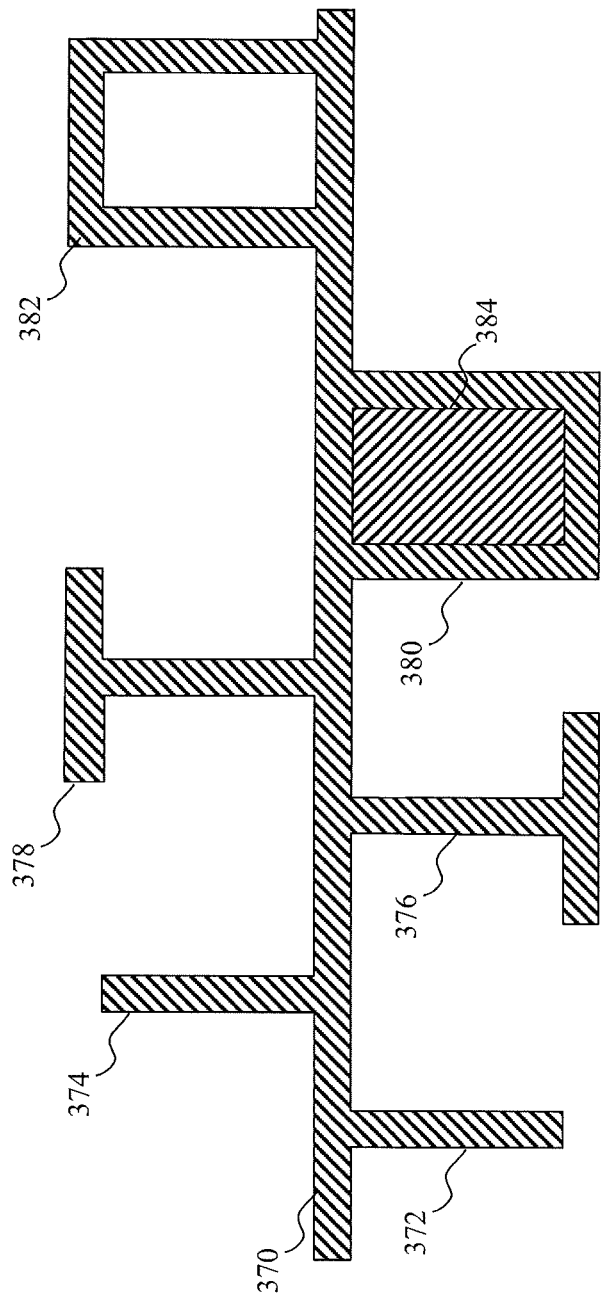
FIG. 19 depicts various forms of strengthening members that may be formed in accordance with the principles of the disclosure.

While strengthening members in the foregoing embodiments were in the form of trenches and lips, ALD may be used to provide strengthening members with other shapes. Some exemplary shapes are depicted in FIG. 19. FIG. 19 depicts a membrane 370 with strengthening members 372, 374, 376, 378, 380, and 382. The strengthening members 372 and 374 are single vertical members formed below and above the membrane 370 respectively. The strengthening members 376 and 378 are "T" shaped members formed below and above the membrane 370 respectively. The strengthening members 380 and 382 are tubes, which can be open-ended or close-ended. Additionally, the tubes 380 and 382 may be filled with another material such as the material 384 if desired.

Each of the strengthening members 372, 374, 376, 378, 380, and 382 can be formed using techniques such as those previously described. The number, orientation, relative size, and fill material may be adapted to provide a desired amount of rigidity.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A method of forming a semiconductor device comprising:
    providing a substrate;
    forming a sacrificial layer above the substrate layer;
    forming a first trench completely through the sacrificial layer;
    forming a first conductive sidewall layer with a thickness of less than about 50 nm on a first sidewall of the first trench using atomic layer deposition (ALD), wherein the first conductive sidewall provides electrical connectivity to a sensor portion of the semiconductor device;
    forming a first bottom layer with a thickness of less than about 50 nm at the bottom of the first trench using ALD; and
    removing the sacrificial layer.

2. The method of claim 1, further comprising:
    forming a second trench in the sacrificial layer; and
    forming a second sidewall layer with a thickness of less than about 50 nm on a second sidewall of the second trench using ALD, wherein the second trench does not extend completely through the sacrificial layer.

3. The method of claim 2, further comprising:
forming the sacrificial layer above a mirror;
forming the second trench directly above the mirror; and
forming an absorber layer directly above the mirror, wherein the absorber layer, the first sidewall, and the second sidewall are formed simultaneously using ALD.

4. The method of claim 1, further comprising:
forming a second sidewall layer on the first sidewall layer.

5. The method of claim 4, wherein forming a first trench comprises:
exposing a portion of a feed through buried within an insulator layer by forming the first trench.

6. The method of claim 5, further comprising:
re-exposing a portion of the feed through by forming a hole in the first bottom layer; and
forming a second bottom layer on the re-exposed portion of the feed through.

7. The method of claim 6, wherein the semiconductor device is a bolometer.

8. A complementary metal oxide semiconductor (CMOS) sensor device comprising:
a CMOS substrate;
a first conductive sidewall extending upwardly away from the CMOS substrate, the first sidewall having a wall thickness of less than about 50 nm, the first conductive sidewall electrically coupled with a sensor portion of the device;
a first conductive bottom portion formed integrally with the first sidewall and in electrical communication with the CMOS substrate;
a second sidewall extending upwardly away from the CMOS substrate, the second sidewall formed on the first sidewall;
a second bottom portion formed integrally with the second sidewall; and
an extension formed integrally with the second bottom portion, the extension extending downwardly from the second bottom portion toward the CMOS substrate through an opening in the first conductive bottom portion.

9. The sensor device of claim 8, further comprising:
a first rim formed integrally with the first sidewall, the first rim extending away from the first sidewall along a plane generally parallel to an upper surface of the CMOS substrate.

10. The sensor device of claim 9, the sensor portion further comprising:
a membrane formed integrally with the first rim, the membrane extending away from the first rim along the plane.

11. The sensor device of claim 10, wherein the membrane defines a perimeter, the membrane further comprising:
a strengthening member located proximate to the perimeter, the strengthening member having a maximum wall thickness of less than about 50 nm.

12. The sensor device of claim 8, further comprising:
an insulator layer on an upper surface of the CMOS substrate; and
a feed through having a first portion abutting the extension and a second portion extending along the plane within the insulator layer.

13. The sensor device of claim 12, further comprising:
a bond pad integrally formed with the feed through; and
an opening formed through an upper surface of the insulator layer such that an upper surface portion of the bond pad is not in contact with the insulator layer.

14. The sensor device of claim 13, further comprising;
a bond ring formed on the upper surface of the insulator layer, a portion of the bond ring located directly above the second portion of the feed through.

15. The sensor device of claim 14, further comprising:
a first rim formed integrally with the first sidewall, the first rim extending away from the first sidewall along a plane generally parallel to an upper surface of the CMOS substrate, the first rim configured such that no portion of the first rim is located directly above any portion of the bond ring.

16. The sensor device of claim 15, the sensor portion comprising:
a membrane formed integrally with the first rim, the membrane extending away from the first rim along the plane.

17. The sensor device of claim 16, wherein the membrane defines a perimeter, the membrane further comprising:
a strengthening member located proximate to the perimeter, the strengthening member having a maximum wall thickness of less than about 50 nm.

18. The sensor device of claim 17, further comprising:
a second rim formed integrally with the second sidewall, the second rim extending away from the second sidewall along the plane.

19. The sensor device of claim 17, further comprising:
a mirror positioned directly beneath, and spaced apart from, the strengthening member.

* * * * *